United States Patent
Simsek-Ege

(10) Patent No.: US 11,810,838 B2
(45) Date of Patent: Nov. 7, 2023

(54) MICROELECTRONIC DEVICES, AND RELATED ELECTRONIC SYSTEMS AND METHODS OF FORMING MICROELECTRONIC DEVICES

(71) Applicant: Micron Technology, Inc., Boise, ID (US)

(72) Inventor: Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 66 days.

(21) Appl. No.: 17/364,292

(22) Filed: Jun. 30, 2021

(65) Prior Publication Data
US 2023/0005816 A1    Jan. 5, 2023

(51) Int. Cl.
H01L 23/48    (2006.01)
H01L 23/00    (2006.01)
(Continued)

(52) U.S. Cl.
CPC ............ *H01L 23/481* (2013.01); *H01L 24/05* (2013.01); *H01L 24/08* (2013.01); *H01L 24/80* (2013.01);
(Continued)

(58) Field of Classification Search
CPC ........... H01L 25/0657; H01L 27/10814; H01L 27/10855; H01L 2924/1431; H01L 2924/1436
See application file for complete search history.

(56) References Cited

U.S. PATENT DOCUMENTS 5,953,630 A    9/1999    Maeda et al.
8,067,286 B2    11/2011    Parekh et al.
(Continued)

FOREIGN PATENT DOCUMENTS

CN    112614853 A    4/2021
CN    112802855 A  *  5/2021    ........ H01L 27/11568
(Continued)

OTHER PUBLICATIONS

International Search Report for International Application No. PCT/US2022/073180, dated Nov. 2, 2022, 3 pages.
(Continued)

*Primary Examiner* — Mamadou L Diallo
(74) *Attorney, Agent, or Firm* — TraskBritt

(57) ABSTRACT

A microelectronic device comprises a first microelectronic device structure, a second microelectronic device structure attached to the first microelectronic device structure. The first microelectronic device structure comprises a first memory array region comprising memory cells, each of the memory cells comprising an access device and a charge storage device operably coupled to the access device. The first microelectronic device structure further comprises a first base structure comprising first control logic devices configured to effectuate one or more control operations of the memory cells of the first memory array region. The second microelectronic device structure comprises a second memory array region comprising additional memory cells, each of the additional memory cells comprising an additional access device and an additional charge storage device operably coupled to the additional access device. The second microelectronic device further a second base structure comprising second control logic devices configured to effectuate one or more control operations of the additional memory cells of the second memory array region. Related micro- (Continued)

electronic devices, electronic systems, and methods are also described.

27 Claims, 10 Drawing Sheets

(51) Int. Cl.
*H01L 25/065* (2023.01)
*H10B 12/00* (2023.01)

(52) U.S. Cl.
CPC ..... *H01L 25/0657* (2013.01); *H10B 12/0335* (2023.02); *H10B 12/315* (2023.02); *H10B 12/50* (2023.02); *H01L 2224/05147* (2013.01); *H01L 2224/08146* (2013.01); *H01L 2224/80896* (2013.01); *H01L 2225/06524* (2013.01); *H01L 2225/06544* (2013.01); *H01L 2924/1431* (2013.01); *H01L 2924/1436* (2013.01)

(56) References Cited

U.S. PATENT DOCUMENTS

| | | | |
|---|---|---|---|
| 8,153,499 B2 | 4/2012 | Or-Bach et al. | |
| 8,184,471 B2 | 5/2012 | Woo et al. | |
| 8,546,188 B2 | 10/2013 | Liu et al. | |
| 8,716,116 B2 | 5/2014 | Parekh et al. | |
| 9,543,433 B2 | 1/2017 | Anathan et al. | |
| 10,510,738 B2 * | 12/2019 | Kim | H01L 27/11573 |
| 11,114,335 B1 | 9/2021 | Lu | |
| 11,557,572 B2 * | 1/2023 | Huang | H01L 24/80 |
| 11,562,985 B2 * | 1/2023 | Liu | H01L 24/08 |
| 2002/0127846 A1 | 9/2002 | Burrell et al. | |
| 2009/0108318 A1 | 4/2009 | Yoon et al. | |
| 2009/0168482 A1 | 7/2009 | Park et al. | |
| 2010/0155932 A1 | 6/2010 | Gambino et al. | |
| 2010/0230724 A1 | 9/2010 | Sinha et al. | |
| 2014/0117420 A1 | 5/2014 | Chen et al. | |
| 2016/0260756 A1 | 9/2016 | Yamagishi | |
| 2019/0043836 A1 * | 2/2019 | Fastow | H01L 27/11573 |
| 2019/0074277 A1 | 3/2019 | Ramaswamy | |
| 2019/0103302 A1 | 4/2019 | Yoon | |
| 2019/0104260 A1 | 4/2019 | Izuhara | |
| 2019/0164914 A1 | 5/2019 | Hu et al. | |
| 2019/0214560 A1 * | 7/2019 | BrightSky | H01L 45/1666 |
| 2019/0244933 A1 | 8/2019 | Or-Bach et al. | |
| 2020/0066730 A1 | 2/2020 | Guo et al. | |
| 2020/0083229 A1 | 3/2020 | Kim et al. | |
| 2020/0111793 A1 | 4/2020 | Kim et al. | |
| 2020/0203272 A1 * | 6/2020 | Doebler | H01L 23/53257 |
| 2020/0258876 A1 | 8/2020 | Hosoda et al. | |
| 2020/0286875 A1 | 9/2020 | Nishida et al. | |
| 2020/0328186 A1 | 10/2020 | Liu | |
| 2020/0350014 A1 * | 11/2020 | Liu | G11C 16/10 |
| 2020/0395328 A1 | 12/2020 | Fastow et al. | |
| 2020/0411524 A1 | 12/2020 | Arslan et al. | |
| 2021/0036015 A1 * | 2/2021 | Lim | H01L 28/20 |
| 2021/0043606 A1 | 2/2021 | Bowers et al. | |
| 2021/0118887 A1 | 4/2021 | Kuo | |
| 2021/0118890 A1 | 4/2021 | Kim et al. | |
| 2021/0143115 A1 | 5/2021 | Wu et al. | |
| 2021/0159216 A1 | 5/2021 | Wu et al. | |
| 2021/0183996 A1 | 6/2021 | Lee et al. | |
| 2021/0217716 A1 | 7/2021 | Wu et al. | |
| 2021/0257266 A1 * | 8/2021 | Oh | H01L 22/12 |
| 2021/0265295 A1 | 8/2021 | Liu et al. | |
| 2021/0296284 A1 | 9/2021 | Sharangpani et al. | |
| 2021/0383874 A1 * | 12/2021 | Oh | H01L 27/11582 |
| 2021/0398967 A1 | 12/2021 | Parekh | |
| 2021/0407980 A1 * | 12/2021 | Young | H01L 27/1159 |
| 2022/0005820 A1 * | 1/2022 | Kim | H01L 27/11556 |
| 2022/0052010 A1 * | 2/2022 | Goda | H01L 27/11565 |
| 2022/0077090 A1 | 3/2022 | Setta | |
| 2022/0077129 A1 * | 3/2022 | Sung | H01L 23/3128 |
| 2022/0085048 A1 * | 3/2022 | Lee | H01L 27/088 |
| 2022/0123006 A1 * | 4/2022 | Ahn | H01L 27/11556 |
| 2022/0216239 A1 | 7/2022 | Yoo et al. | |
| 2022/0302150 A1 * | 9/2022 | Zhang | H01L 27/11526 |
| 2022/0328493 A1 | 10/2022 | Wang et al. | |
| 2022/0367505 A1 * | 11/2022 | Chen | H01L 25/18 |
| 2022/0399309 A1 * | 12/2022 | Simsek-Ege | H01L 25/50 |
| 2023/0015040 A1 * | 1/2023 | Or-Bach | H01L 24/08 |

FOREIGN PATENT DOCUMENTS

| | | |
|---|---|---|
| CN | 113053435 A | 6/2021 |
| TW | 201523855 A | 6/2015 |
| TW | 202125778 A | 7/2021 |
| WO | 2008063251 A2 | 5/2008 |
| WO | 2020/211272 A1 | 10/2020 |

OTHER PUBLICATIONS

International Written Opinion for International Application No. PCT/US2022/073180, dated Nov. 2, 2022, 4 pages.
Simsek-Ege et al., U.S. Appl. No. 17/364,377 (Year: 2021).
Simsek-Ege et al., U.S. Appl. No. 17/364,476 (Year: 2021).

* cited by examiner

MICROELECTRONIC DEVICES, AND RELATED ELECTRONIC SYSTEMS AND METHODS OF FORMING MICROELECTRONIC DEVICES

TECHNICAL FIELD

The disclosure, in various embodiments, relates generally to the field of microelectronic device design and fabrication. More specifically, the disclosure relates to methods of forming microelectronic devices comprising at least two microelectronic device structures, and to related microelectronic devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, volatile memory devices, such as dynamic random access memory (DRAM) devices; and non-volatile memory devices such as NAND Flash memory devices. A typical memory cell of a DRAM device includes one access device, such as a transistor, and one memory storage structure, such as a capacitor, Modern applications for semiconductor devices can employ significant quantities of memory cells, arranged in memory arrays exhibiting rows and columns of the memory cells. The memory cells may be electrically accessed through digit lines (e.g., bit lines, data lines) and word lines access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) of the memory cells of the memory device. However, as the number of memory cells in a memory device increase, the quantities, dimensions and arrangements of the different control logic devices employed within the base control logic structure can also impede reductions to the size (e.g., horizontal footprint) of the memory device, and/or improvements in the performance (e.g., faster memory cell ON/OFF speed, lower threshold switching voltage requirements, faster data transfer rates, lower power consumption) of the memory device. Furthermore, as the density and complexity of the memory array have increased, so has the complexity of the control logic devices. In some instances, the control logic devices consume more real estate than the memory devices, reducing the memory density of the memory device.

DETAILED DESCRIPTION

Figure 1A:
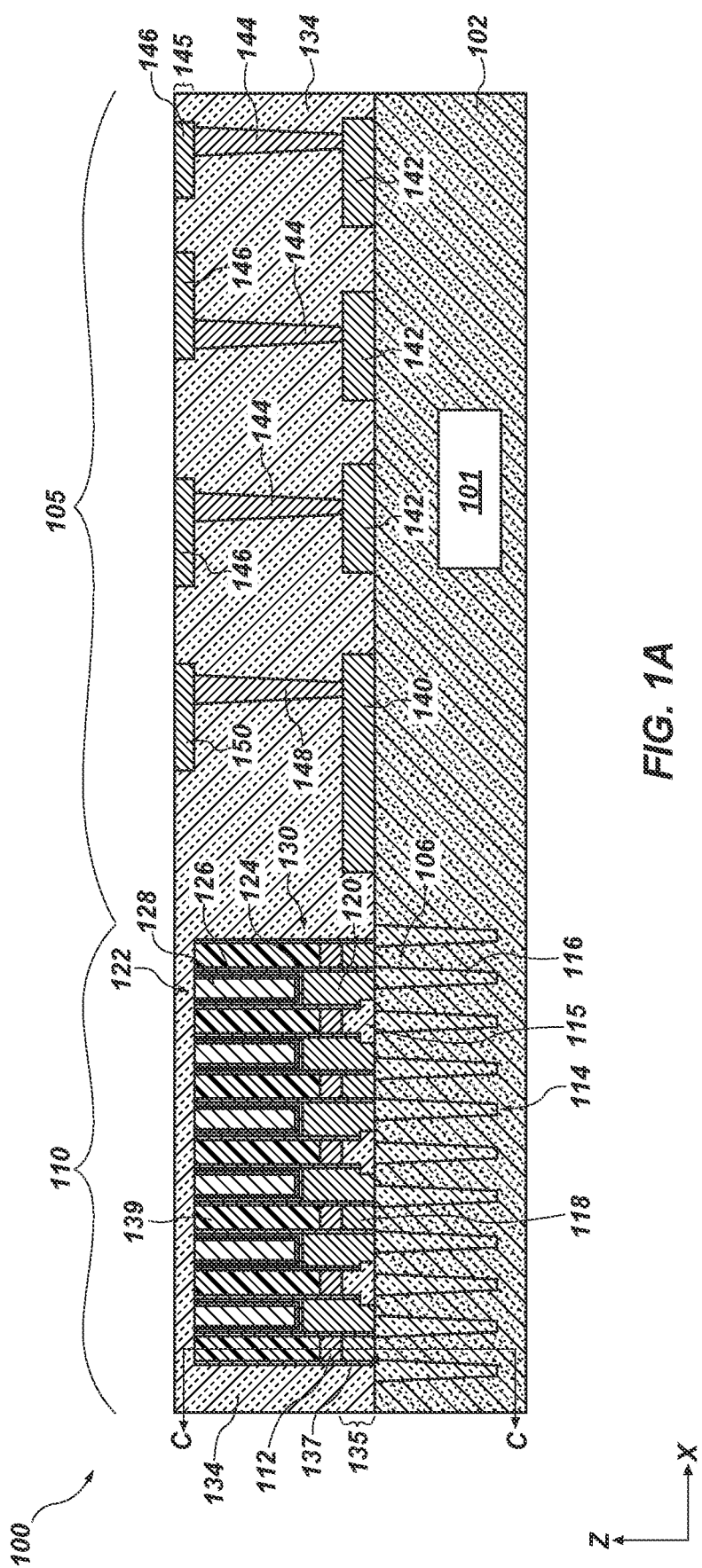
FIG. 1A through FIG. 1F are simplified partial cross-sectional views (FIG. 1A, FIG. 1C through FIG. 1F) and a partial top-down view (FIG. 1B) illustrating a method of forming a microelectronic device, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device includes a first microelectronic device structure and at least a second microelectronic device structure coupled to the first microelectronic device structure. The first microelectronic device structure may include, for example, a first memory array region, a first peripheral region laterally neighboring the first memory array region, and a first base structure. The first memory array region may include one or more memory cells, each comprising a charge storage material (e.g., a capacitor) and an access device (e.g., a transistor). Local interconnect structures may electrically couple each of the charge storage devices to a particular access device. The first base structure comprises first control logic devices such as complementary-metal-oxide semiconductor (CMOS) circuitry and logic devices configured to effectuate a portion of control operations of the memory cells. The first peripheral region may include various routing structures and conductive interconnect structures for coupling the components of the memory cells to the control logic circuitry of the first control logic devices. The local interconnect structures may be electrically coupled to the first peripheral region through conductive interconnect structures and routing structures. The first microelectronic device structure may include a metallization level comprising conductive bond pad structures vertically overlying the charge storage materials of the first memory array.

The second microelectronic device structure may include a second memory array region, a second peripheral region, and a second base structure comprising a second control logic region. The second memory array region may include memory cells substantially similar to the memory cells of the first memory array region. The second control logic region may include first control logic devices and circuitry configured to effectuate a portion of control operations of the memory cells of the second memory array. The second peripheral region includes conductive interconnect structures electrically coupled to the conductive bond pad structures of the first microelectronic device structure. At least some of the conductive interconnect structures vertically extend through the second microelectronic device structure and are in electrical communication with a back end of the line structure on a side of the second microelectronic device structure opposite the first microelectronic device structure. The microelectronic device including the first microelectronic device structure and the second microelectronic device structure facilitates increasing a number of memory cells of the microelectronic device with a reduced number of metallization and routing layers since the first microelectronic device structure and the second microelectronic device structure share a back end of line structure and metallization levels. In some embodiments, the metallization between the back end of line structure and the memory cells (e.g., the local interconnect structures) may comprise copper or another low parasitic material (e.g., a low RC material), facilitating an increase in data transmission speeds between input and output devices, for example. In some embodiments, the second microelectronic device structure is attached to the first microelectronic device structure by oxide-to-oxide bonding between the first microelectronic device structure and the second microelectronic device structure.

FIG. 1A through FIG. 1F are simplified partial cross-sectional views (FIG. 1A and FIG. 1C through FIG. 1F) and a simplified partial top-down view (FIG. 1B) illustrating a method of forming a microelectronic device, (e.g., a stacked memory device, such as a 3D DRAM memory device), in accordance with embodiments of the disclosure. With the description provided below, it will be readily apparent to one of ordinary skill in the art that the methods and structures described herein with reference to FIG. 1A through FIG. 1F may be used in various devices and electronic systems.

Referring to FIG. 1A, a first microelectronic device structure 100 may include a peripheral region 105 and a first array region 110 laterally (e.g., in the X-direction, in the Y-direction) neighboring the peripheral region 105. As will be described herein, the first array region 110 may include memory cells 130 each comprising a storage node structure 122 operably coupled to an access device (e.g., access device 125 (FIG. 1C)). The first microelectronic device structure 100 may also be referred to herein as a "first die."

The first microelectronic device structure 100 includes a first base structure 102 vertically (e.g., in the Z-direction) underlying the memory cells 130. The first base structure 102 may include a semiconductive structure (e.g., a semiconductive wafer), or a base semiconductive material on a support structure or construction upon which additional materials and structures of the first microelectronic device structure 100 are formed. For example, the first base structure 102 may comprise a conventional silicon substrate (e.g., a conventional silicon wafer), or another bulk substrate comprising a semiconductive material. As used herein, the term "bulk substrate" means and includes not only silicon substrates, but also silicon-on-insulator (SOI) substrates, such as silicon-on-sapphire (SOS) substrates and silicon-on-glass (SOG) substrates, epitaxial layers of silicon on a base semiconductive foundation, and other substrates formed of and including one or more semiconductive materials (e.g., one or more of a silicon material, such monocrystalline silicon or polycrystalline silicon; silicon-germanium; germanium; gallium arsenide; a gallium nitride; and indium phosphide). In some embodiments, the first base structure 102 comprises a silicon wafer.

The first base structure 102 may include different layers, structures, devices, and/or regions formed therein and/or thereon. For example, the first base structure 102 may include a first control logic region 101 comprising one or more first control logic devices. The first control logic devices of the first control logic region 101 may include employ conventional complementary metal-oxide-semiconductor (CMOS) devices (e.g., conventional CMOS inverters, conventional CMOS NAND gates, conventional CMOS transmission pass gates, etc.), which are not described in detail herein.

By way of non-limiting example, the first control logic devices of the first control logic region 101 of the first base structure 102 may include one or more of (e.g., each of) voltage pumps (also referred to as charge pumps) (e.g., $V_{CCP}$ charge pumps, $V_{NEGWL}$ charge pumps, DVC2 charge pumps), delay-locked loop (DLL) circuitry (e.g., ring oscillators), drain supply voltage ($V_{dd}$) regulators, and various chip/deck control circuitry, block switches (e.g., configured and operated for selection of memory cells of the first array region 110), drivers (e.g., string drivers, column drivers), select devices (e.g., row select devices, column select devices), decoders (e.g., local deck decoders, column decoders), repair circuitry (e.g., column repair circuitry), memory test devices, array multiplexers (MUX), and error checking and correction (ECC) devices; control devices configured to control row operations for arrays (e.g., memory element array(s), access device array(s)) within the first array region 110 of the first microelectronic device structure 100, such as one or more (e.g., each) of decoders (e.g., local deck decoders, row decoders), repair circuitry (e.g., row repair circuitry), memory test devices, MUX, ECC devices, self-refresh/wear leveling devices, page buffers, data paths, I/O devices (e.g., local I/O devices) and controller logic (timing circuitry, clock devices (e.g., a global clock device)), deck enable, read/write circuitry, address circuitry, logic for controlling the regulation of voltage references when biasing particular memory cells 130 of the first array region 110 into a read or write state, or for generating row and column addresses, or other logic devices and circuitry.

Figure 1B:
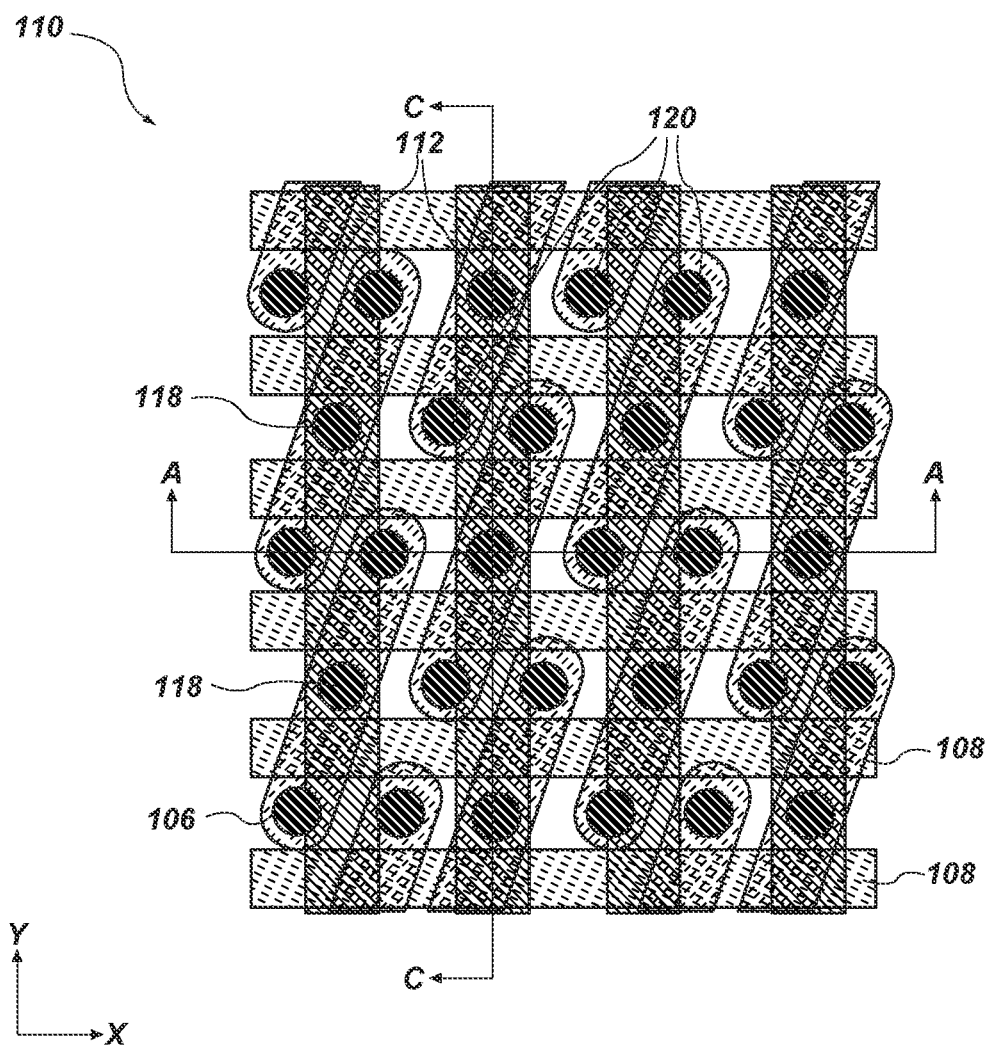

FIG. 1B is a simplified partial top-down view of the first array region 110 of the first microelectronic device structure 100. With combined reference to FIG. 1A and FIG. 1B, active areas 106 (also referred to herein as "pillars") may be defined within the first base structure 102. The active areas 106 may be aligned at an angle, relative to word lines 108 that extend in a first lateral direction (e.g., the X-direction). With reference to FIG. 1A, the active areas 106 may be spaced from each other by isolation structures 114 comprising a dielectric material 116.

The dielectric material 116 may be formed of and include insulative material, such as, for example, one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), a nitride material (e.g., silicon nitride ($Si_3N_4$)) or an oxynitride material (e.g., silicon oxynitride), and amorphous carbon. In some embodiments, the dielectric material 116 comprises silicon dioxide.

With reference to FIG. 1A and FIG. 1B, portions of each of the active areas 106 may be in contact with a conductive contact 118 (also referred to herein as a "digit line contact") and storage node contacts 120. In some embodiments, each of the active areas 106 is in contact with two storage node contacts 120 and a conductive contact 118 between the two storage node contacts 120. In some embodiments, the storage node contacts 120 may each be located at opposite lateral ends of the active areas 106 and the conductive contact 118 may be located at a laterally central portion of the active areas 106. With reference to FIG. 1A, the storage node contacts 120 and the conductive contacts 118 vertically (e.g., in the Z-direction) overlie the active areas 106.

The storage node contacts 120 may be electrically isolated from the conductive contacts 118 and the conductive lines 112 by a dielectric material 137, which may include one or more of the materials described above with reference to the dielectric material 116. In some embodiments, a dielectric material 139 may vertically overlie the conductive lines 112. The dielectric material 139 may be formed of and include one or more of the materials described above with reference to the dielectric material 116.

In some embodiments, portions of the active areas 106 in contact with the storage node contacts 120 may be referred to herein as "drain regions" of access devices (e.g., access devices 125 (FIG. 1C)) and the portions of the active areas 106 in contact with the conductive contacts 118 may be referred to herein as "source regions" of the access devices.

Each of the storage node contacts 120 and the conductive contacts 118 may individually be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, or other materials exhibiting electrical conductivity. In some embodiments, the storage node contacts 120 and the conductive contacts 118 individually comprise tungsten.

With reference to FIG. 1A, the storage node contacts 120 may each individually be in electrical communication with a storage node structure 122. The storage node structures 122 may individually comprise a first electrode 124 (also referred to herein as a "bottom electrode"), a second electrode 128 (also referred to herein as a "top electrode"), and a dielectric material 126 directly between the first electrode 124 and the second electrode 128. In some such embodiments, the storage node structures 122 comprise capacitors. However, the disclosure is not so limited and in other embodiments, the storage node structures 122 may each individually comprise other structures, such as, for example, phase change memory (PCM), resistance random-access memory (RRAM), conductive-bridging random-access memory (conductive bridging RAM), or another structure for storing a logic state of the memory cells 130.

The first electrode 124 may be formed of and include conductive material such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, or other materials exhibiting electrical conductivity. In some embodiments, the first electrode 124 comprises titanium nitride.

The second electrode 128 may be formed of and include conductive material. In some embodiments, the second electrode 128 comprises one or more of the materials described above with reference to the first electrode 124. In some embodiments, the second electrode 128 comprises substantially the same material composition as the first electrode 124.

The dielectric material 126 may be formed of and include one or more of silicon dioxide, silicon nitride, polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$) (STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT), etc.), or a high-k dielectric material.

With reference to FIG. 1A and FIG. 1B, the conductive contacts 118 may be in electrical communication with a conductive line 112, which may also be referred to herein as a "digit line." The conductive lines 112 may extend in a lateral direction (e.g., the Y-direction) substantially perpendicular to the word lines 108. In some embodiments, each conductive line 112 is individually coupled to conductive contacts 118 that are arranged in a particular column and are aligned in a lateral direction (e.g., the X-direction).

The conductive lines 112 may be formed of and include conductive material. In some embodiments, the conductive lines 112 comprise one or more of the materials described above with reference to the conductive contacts 118. In some embodiments, the conductive lines 112 comprise the substantially the same material composition as the conductive contacts 118. In other embodiments, the conductive lines 112 comprise a different material composition than the conductive contacts 118. In some embodiments, the conductive lines 112 comprise tungsten.

In the cross-sectional view of FIG. 1A, every other one of the conductive lines 112 may be isolated from the active areas 106 by a dielectric material 115. It will be understood that such conductive lines 112 are in contact with the active areas 106 in a different cross-section than the one illustrated in FIG. 1A.

The dielectric material 115 may be formed of and include insulative material, such as, for example, one or more of the materials described above with reference to the dielectric material 116. In some embodiments, the dielectric material 115 comprises substantially the same material composition as the dielectric material 116. In some embodiments, the dielectric material 115 comprises silicon dioxide.

Figure 1C:
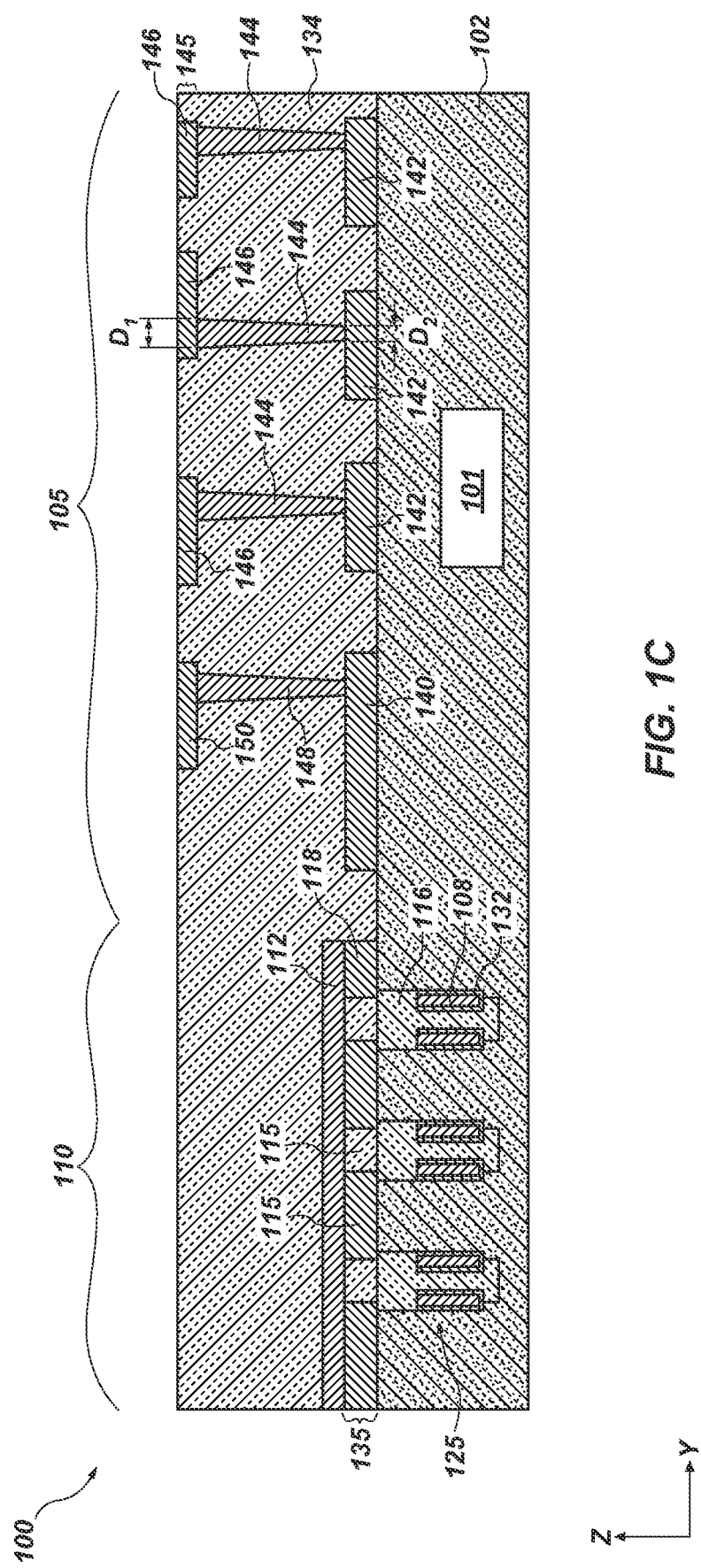

With reference to FIG. 1B and FIG. 1C, the word lines 108 may extend along portions of the active areas 106 and may be electrically connected to active areas 106 arranged in rows extending in a lateral direction (e.g., the X-direction). The word lines 108 may comprise a portion of access devices 125 configured for selecting a storage node structure 122 to read or write a logic value to the storage node structure 122.

The word lines 108 may be formed of and include conductive material, such as, for example, one or more of the materials described above with reference to the conductive line 112. In some embodiments, the word lines 108 comprise substantially the same material composition as the conductive lines 112. In other embodiments, the word lines 108 comprise a different material composition than the conductive lines 112. In some embodiments, the word lines 108 comprise tungsten.

The word lines 108 may be separated from the active areas 106 by a dielectric material 132, which may also be referred to herein as a "gate dielectric material." The dielectric material 132 may be formed of an include insulative material, such as one or more of phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), a dielectric carboxynitride material (e.g., silicon carboxynitride (SiOCN)), or combinations thereof.

With reference to FIG. 1A and FIG. 1C, an insulative material 134 may vertically (e.g., in the Z-direction) overlie the memory cells 130 within the first array region 110 and may vertically overlie portions of the peripheral region 105. The insulative material 134 may be formed of and include one or more of the materials described above with reference to the dielectric material 116. In some embodiments, the insulative material 134 comprises substantially the same material composition as the dielectric material 116. In some embodiments, the insulative material 134 comprises silicon dioxide.

In some embodiments, the storage node contacts 120 and the conductive contacts 118 comprise a portion of a metallization and local interconnect level 135 of the first microelectronic device structure 100. The metallization and local interconnect level 135 include conductive structures for electrically connecting portions of the memory cells 130 to other portions of the first microelectronic device structure 100, such as to regions and circuitry within the first base structure 102 (e.g., to one or more of the first control logic devices of the first control logic region 101) and to the peripheral region 105.

The metallization and local interconnect level 135 may further include first routing structures 140 which may be electrically coupled to portions of the memory cells 130. For example, the first routing structures 140 may be in electrical communication with the word lines 108 and with a word line driver of the first control logic region 101 within the first base structure 102. Other first routing structures 140 may be in electrical communication with the conductive lines 112 and with one or more sense amplifiers within the first control logic region 101 of first base structure 102.

First conductive pad structures 142 may be in electrical communication with the first base structures 102 within the peripheral region 105. The first conductive pad structures 142 may be in electrical communication with, for example, circuits within the first base structure 102, such as circuits of the one or more first control logic devices of the first control logic region 101 of the first base structure 102.

The first conductive pad structures 142 may be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, or other materials exhibiting electrical conductivity. In some embodiments, the first conductive pad structures 142 comprise tungsten. In other embodiments, the first conductive pad structures 142 comprise copper.

First conductive interconnect structures 144 may be in electrical communication with the first conductive pad structures 142 and may electrically couple the first conductive pad structures 142 with first conductive landing pad structures 146 of a first metallization level 145.

In some embodiments, a diameter $D_1$ of the upper (e.g., in the Z-direction) portion of the first conductive interconnect structures 144 may be within a range from about 200 nanometers (nm) to about 300 nm, such as from about 200 nm to about 250 nm, or from about 250 nm to about 300 nm. In some embodiments, a diameter $D_2$ of the lower (e.g., in the Z-direction) portion of the first conductive interconnect structures 144 may be within a range from about 50 nm to about 100 nm, such as from about 50 nm to about 75 nm, or from about 75 nm to about 100 nm.

Second conductive interconnect structures 148 may be in electrical communication with the first routing structures 140 and may electrically connect the first routing structures 140 to second conductive landing pad structures 150 within the first metallization level 145.

Each of the first conductive interconnect structures 144 and the second conductive interconnect structures 148 may individually be formed of and include conductive material, such as, for example, one or more of the materials described above with reference to the first conductive pad structures 142. In some embodiments, the first conductive interconnect structures 144 and the second conductive interconnect structures 148 individually comprise substantially the same material composition as the first conductive pad structures 142. In some embodiments, the first conductive interconnect structures 144 and the second conductive interconnect structures 148 individually comprise tungsten.

Each of the first conductive landing pad structures 146 and the second conductive landing pad structures 150 may individually be formed of and include conductive material, such as, for example, one or more of the materials described above with reverence to the first conductive pad structures 142. In some embodiments, the first conductive landing pad structures 146 and the second conductive landing pad structures 150 individually comprise substantially the same material composition as the first conductive pad structures 142. In some embodiments, the first conductive landing pad structures 146 and the second conductive landing pad structures 150 individually comprise tungsten. In other embodiments, the first conductive landing pad structures 146 and the second conductive landing pad structures 150 individually comprise copper.

Figure 1D:
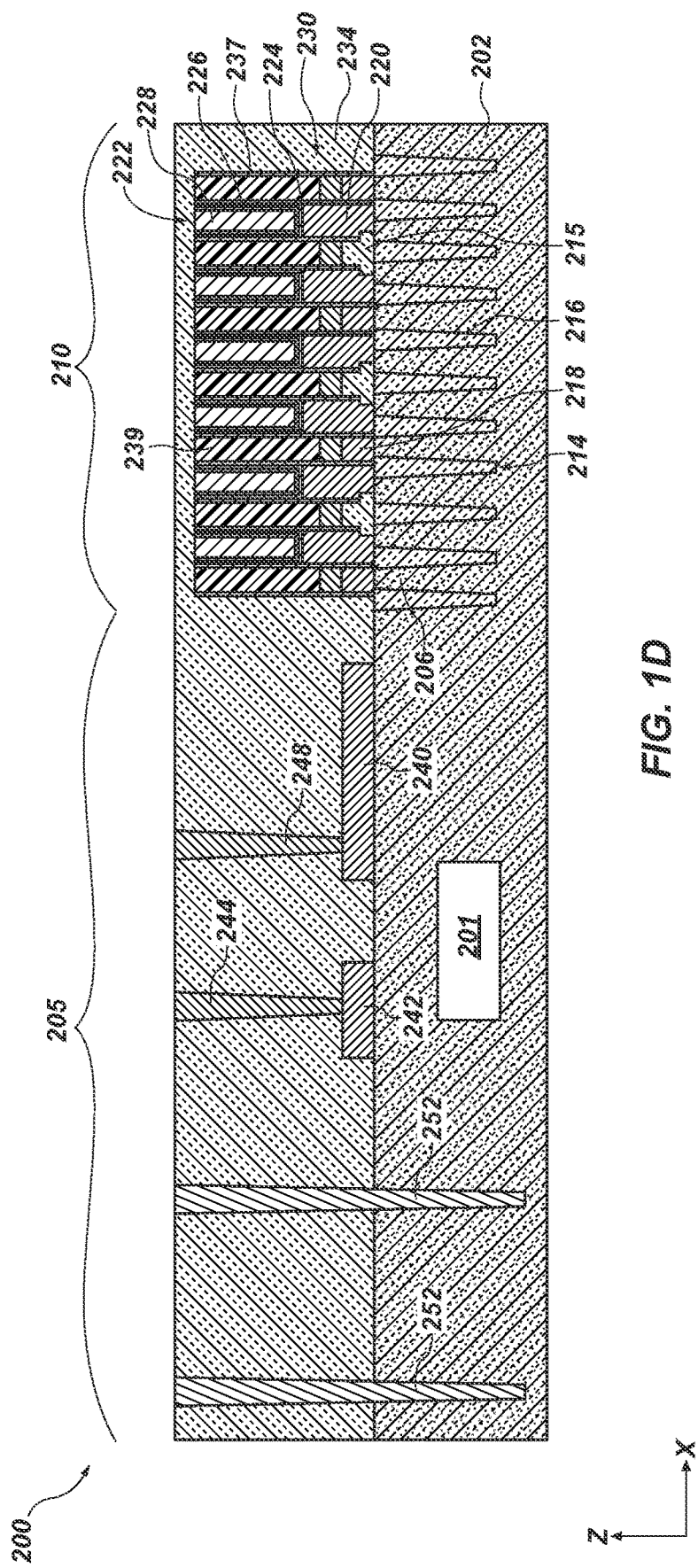

Referring now to FIG. 1D, a second microelectronic device structure 200 may be substantially similar to the first microelectronic device structure 100 and may include, for example, include a peripheral region 205 and a second array region 210 laterally (e.g., in the X-direction, in the Y-direction) neighboring the peripheral region 205. Components of the second microelectronic device structure 200 that are similar to corresponding components of the first microelectronic device structure 100 may retain the same numerical designation, except that reference numerals 1XX are replaced with 2XX. The second microelectronic device structure 200 may also be referred to herein as a "second die."

In some embodiments, the components of the second microelectronic device structure 200 may be arranged in a mirror image relative to the structures of the first microelectronic device structure 100 such that when the second microelectronic device structure 200 is vertically (e.g., in the Z-direction) inverted (e.g., flipped), as will be described herein, structures of the second microelectronic device structure 200 are laterally (e.g., in the X-direction, in the Y-direction) aligned with corresponding structures of the first microelectronic device structure 100.

The second microelectronic device structure 200 may be substantially the same as the first microelectronic device structure 100 except that the second microelectronic device structure 200 may not include the first conductive landing pad structures 146 and the second conductive landing pad structures 150.

The second base structure 202 may be substantially the same as the first base structure 102 and may include, for example, a second control logic region 201 including second control logic devices configured to effectuate at least a portion of control operations of the memory cells 230 of the second microelectronic device structure 200. In some embodiments, the second control logic devices of the second control logic region 201 may be substantially the same as the first control logic devices of the first control logic region 101.

In some embodiments, the second base structure 202 may include third conductive interconnect structures 252 vertically (e.g., in the Z-direction) extending at least partially through the second base structure 202 and substantially completely through the insulative material 234. Fourth conductive interconnect structures 248 may be electrically coupled to a second routing structure 240 in electrical communication with one or more components of the memory cells 230, as described above with reference to the first routing structure 140. Fifth conductive interconnect structures 244 may be in electrical communication with third conductive pad structures 242.

Each of the third conductive interconnect structures 252, the fourth conductive interconnect structures 248, and the fifth conductive interconnect structures 244 may individually be formed of and include conductive material, such as, for example, one or more of the materials described above with reference to the first conductive interconnect structures 144. In some embodiments, the third conductive interconnect structures 252, the fourth conductive interconnect structures 248, and the fifth conductive interconnect structures 244 individually comprise substantially the same material composition as the first conductive interconnect structures 144. In some embodiments, the third conductive interconnect structures 252, the fourth conductive interconnect structures 248, and the fifth conductive interconnect structures 244 individually comprise tungsten.

The second routing structures 240 may be formed of and include one or more of the materials described above with reference to the first routing structures 140. The third conductive pad structures 242 may be formed of and include one or more of the materials described above with reference to the first conductive pad structures 142.

Figure 1E:
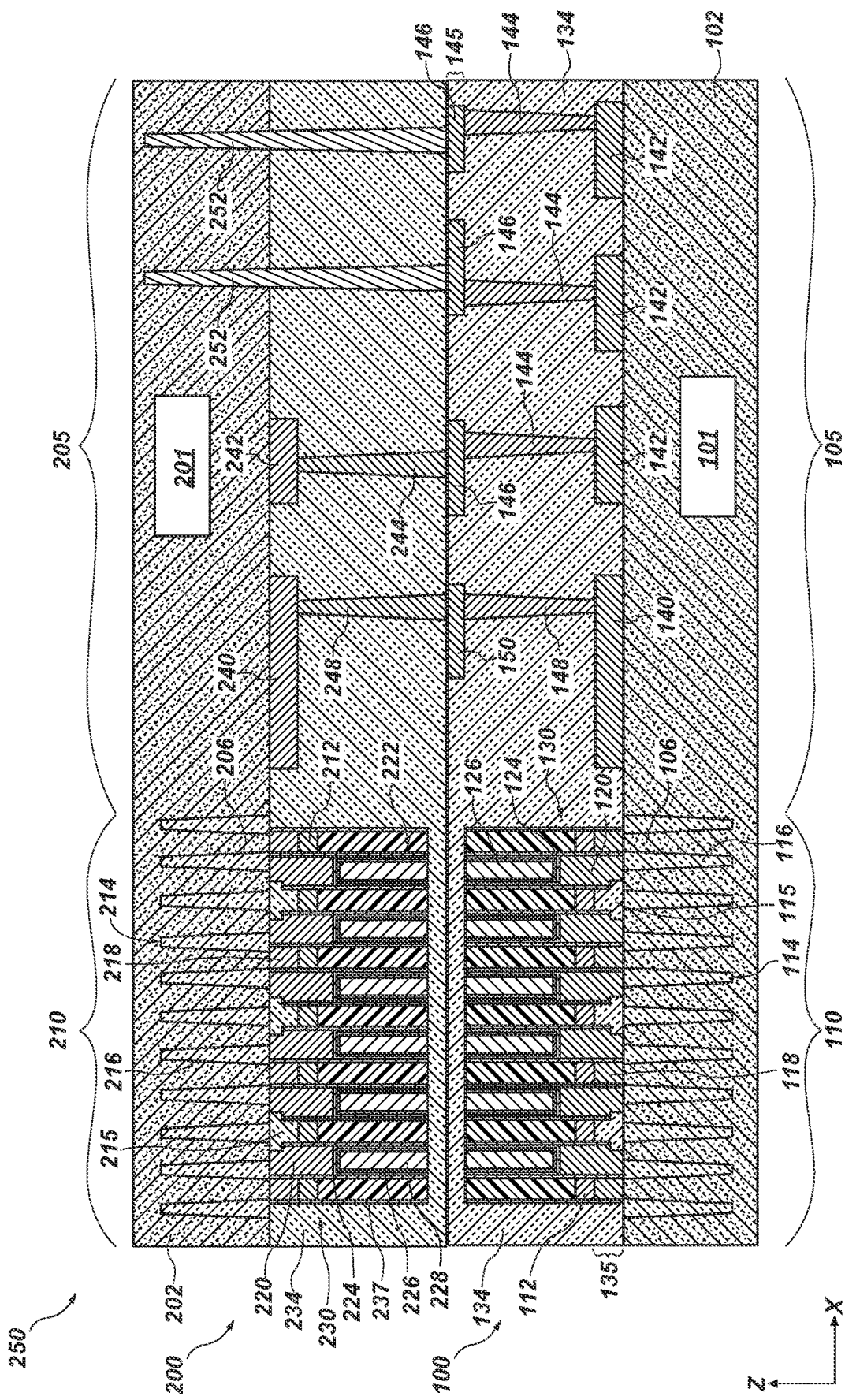

Referring now to FIG. 1E, the second microelectronic device structure 200 may be inverted (e.g., flipped), laterally (e.g., in the X-direction, in the Y-direction) aligned with the first microelectronic device structure 100, and bonded to the first microelectronic device structure 100 to form a microelectronic device structure assembly 250. By way of non-limiting example, the first array region 110 of the first microelectronic device structure 100 may be laterally aligned with the second array region 210 of the second microelectronic device structure 200; and the peripheral region 105 of the first microelectronic device structure 100 may be laterally aligned with the peripheral region 205 of the second microelectronic device structure 200.

In some embodiments, the first conductive landing pad structures 146 and the second conductive landing pad structures 150 of the first metallization level 145 may be in electrical communication with components of the second microelectronic device structure 200. In some embodiments, the fourth conductive interconnect structures 248 of the second microelectronic device structure 200 may be laterally aligned with the second conductive landing pad structures 150 of the first microelectronic device structure 100; the fifth conductive interconnect structures 244 of the second microelectronic device structure 200 may be laterally aligned with the first conductive landing pad structures 146 of the first microelectronic device structure 100; and the third conductive interconnect structures 252 of the second microelectronic device structure 200 may be laterally aligned with the first conductive landing pad structures 146 of the first microelectronic device structure 100.

In some embodiments, surfaces of the second microelectronic device structure 200 may contact corresponding surfaces of the first microelectronic device structure 100 and the second microelectronic device structure 200 may be bonded to the first microelectronic device structure 100. For example, the insulative material 134 of the first microelectronic device structure 100 may be bonded to the insulative material 234 of the second microelectronic device structure 200 to attach the first microelectronic device structure 100 to the second microelectronic device structure 200.

In some embodiments, the second array region 210 may be located within laterally (e.g., in the X-direction, in the Y-direction) boundaries defined by the first array region 110. In some embodiments, the second array region 210 is laterally aligned with the first array region 110.

After the insulative material 134 of the first microelectronic device structure 100 is contacted with the insulative material 234 of the second microelectronic device structure 200, the first microelectronic device structure 100 and the second microelectronic device structure 200 may be exposed to annealing conditions to form bonds (e.g., oxide-to-oxide bonds) between the insulative material 134 of the first microelectronic device structure 100 and the insulative material 234 of the second microelectronic device structure 200 to form the microelectronic device structure assembly 250. In some embodiments, the first microelectronic device structure 100 and the second microelectronic device structure 200 are exposed to a temperature greater than, for example, 800° C., to form the oxide-to-oxide bonds and attach the first microelectronic device structure 100 to the second microelectronic device structure 200.

In some embodiments, one or more of (e.g., each of) the fourth conductive interconnect structures 248 may be bonded to the second conductive landing pad structures 150; the fifth conductive interconnect structures 244 may be bonded to some of the first conductive landing pad structures 146; and third conductive interconnect structures 252 may be bonded to other first conductive landing pad structures 146. By way of non-limiting example, at least one thermocompression process may be employed to migrate (e.g., diffuse) and interact material(s) (e.g., copper) of the second conductive landing pad structures 150 to the fourth conductive interconnect structures 248; of first conductive landing pad structures 146 to the fifth conductive interconnect structures 244; and of the first conductive landing pad structures 146 to the third conductive interconnect structures 252.

In some embodiments, and with reference back to FIG. 1C, the insulative material 134 may vertically overlie the first conductive landing pad structures 146 and the second conductive landing pad structures 150. In some such embodiments, at least a portion of the insulative material vertically overlying the first conductive landing pad structures 146 and the second conductive landing pad structures 150 may be removed to electrically connect the first conductive landing pad structures 146 and the second conductive landing pad structures 150 to the respective fifth interconnect structures 244 and the fourth conductive interconnect structures 248. In some embodiments, an interface between the first microelectronic device structure 100 and the second microelectronic device structure 200 may comprise the insulative material 134 and the insulative material 234 (e.g., oxide-to-oxide bonds between the insulative material 134 and the insulative material 234). In some embodiments, the interface may further include one or more of the first conductive landing pad structures 146 and the second conductive landing pad structures 150 in contact with (e.g., bonded with) the insulative material 234 and one or more of the fifth interconnect structures 244 and the fourth conductive interconnect structures 248 in contact with (e.g., bonded with) the insulative material 134. In some embodiments, the fifth interconnect structures 244 and the fourth conductive interconnect structures 248 may be spaced from the first conductive landing pad structures 146 and the second conductive landing pad structures 150 by at least a portion of the insulative material 134.

Figure 1F:
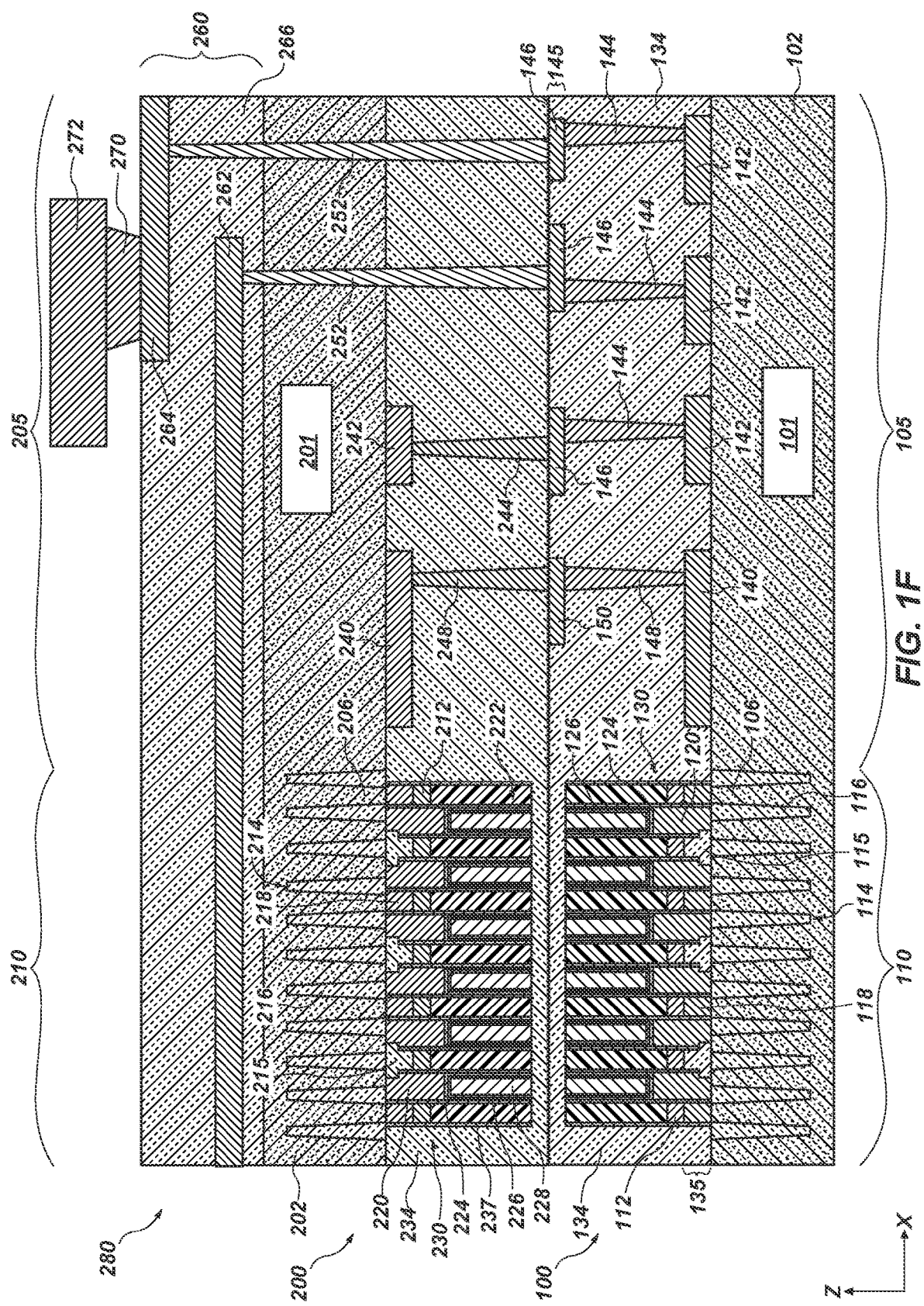

Referring now to FIG. 1F, after bonding the second microelectronic device structure 200 to the first microelectronic device structure 100, the second base structure 202 may be thinned, such as by exposing the second base structure 202 to a chemical mechanical planarization (CMP) process. In some embodiments, thinning the second base structure 202 may expose at least a portion of the third conductive interconnect structures 252.

After thinning the second base structure 202, a back end of line (BEOL) structure 260 may be formed vertically (e.g., in the Z-direction) over the second base structure 202 on a side of the second base structure 202 opposite the memory cells 230 to form a microelectronic device 280. The back end of line structure 260 may include a first metallization structure 262 in electrical communication with one or more of the third conductive interconnect structures 252 and a second metallization structures 264 in electrical communication with at least one or more other third conductive interconnect structures 252.

An insulative material 266 may electrically isolate the first metallization structure 262 and the second metallization structure 264 from each other and from the second base structure 202. The insulative material 266 may be formed of and include one or more of the materials described above with reference to the insulative material 134. In some embodiments, the insulative material 266 comprise substantially the same material composition as the insulative material 134. In some embodiments, the insulative material 266 comprises silicon dioxide.

Each of the first metallization structure 262 and the second metallization structure 264 may individually be formed of and include conductive material, such as, for example, a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, a conductively-doped semiconductor material (e.g., conductively-doped silicon, conductively-doped germanium, conductively-doped silicon germanium, etc.), polysilicon, or other materials exhibiting electrical conductivity. In some embodiments, each of the first metallization structure 262 and the second metallization structure 264 individually comprise tungsten. In other embodiments, each of the first metallization structure 262 and the second metallization structure 264 individually comprise copper.

A sixth conductive interconnect structure 270 may be in electrical communication with the second metallization structure 264 and electrically couple the second metallization structure 264 with a conductive bond pad structure 272.

In some embodiments, the conductive bond pad structure 272 is configured to be electrically coupled to a power source.

The sixth conductive interconnect structure 270 may be formed of and include conductive material, such as, for example, one or more of the materials described above with reference to the first conductive interconnect structures 144. In some embodiments, the sixth conductive interconnect structures 270 comprise substantially the same material composition as the first conductive interconnect structures 144. In some embodiments, the sixth conductive interconnect structures 270 comprise tungsten.

The sixth conductive interconnect structure 270 may be formed of and include conductive material, such as, for example, one or more of the materials described above with reference to the first metallization structure 262. In some embodiments, the sixth conductive interconnect structure 270 comprises copper. In other embodiments, the sixth conductive interconnect structure 270 comprises aluminum.

The conductive bond pad structure 272 may be formed of and include conductive material, such as, for example, one or more of the materials described above with reference to the sixth conductive interconnect structure 270. In some embodiments, the conductive bond pad structure 272 comprises substantially the same material composition as the sixth conductive interconnect structure 270. In other embodiments, the conductive bond pad structure 272 comprises a different material composition than the sixth conductive interconnect structure 270. In some embodiments, the conductive bond pad structure 272 comprises copper. In other embodiments, the conductive bond pad structure 272 comprises aluminum.

Accordingly, the microelectronic device 280 includes a first microelectronic device structure 100 attached to the second microelectronic device structure 200, the first microelectronic device structure 100 and the second microelectronic device structure 200 having substantially the same configuration. For example, the first microelectronic device structure 100 includes the first array region 110 including the memory cells 130. The first microelectronic device structure 100 further includes the first base structure 102 including the first control logic devices of the first control logic region 101 for effectuating at least some of the control operations of the memory cells 130. In some embodiments, the first microelectronic device structure 100 includes only the metallization and local interconnect level 135 and the first metallization level 145 and does not include additional metallization levels. The second microelectronic device structure 200 includes the second array region 210 including the memory cells 230. The second microelectronic device structure 200 further includes the second base structure 202 including the second logic devices of the second control logic region 201 for effectuating at least some of the control operations of the memory cells 230. The first base structure 102 may be located on a side of the first microelectronic device structure 100 opposite the second microelectronic device structure 200. In other words, the memory cells 130 of the first array region 110 of the first microelectronic device structure 100 may be between the second microelectronic device structure 200 and the first base structure 102. Similarly, the second base structure 202 may be located on a side of the second microelectronic device structure 200 opposite the first microelectronic device structure 100. In other words, the memory cells 230 of the second array region 210 of the second microelectronic device structure 200 may be between the second microelectronic device structure 200 and the second base structure 202. In some such embodiments, the first base structure 102 and the second base structure 202 may be located on opposing vertical (e.g., in the Z-direction) sides of the microelectronic device 280. In some embodiments, the memory cells 130 of the first microelectronic device structure 100 vertically (e.g., in the Z-direction) neighbor the memory cells 230 of the second microelectronic device structure 200. The second base structure 202 may be vertically between the second array region 210 and the BEOL structure 260.

In some embodiments, the first microelectronic device structure 100 and the second microelectronic device structure 200 share metallization levels, such as the first metallization structure 262 and the second metallization structure 264. The configuration of the microelectronic device 280 facilitates a reduction in a number of metallization levels for the microelectronic device 280 including the first microelectronic device structure 100 and the second microelectronic device structure 200.

Figure 2A:
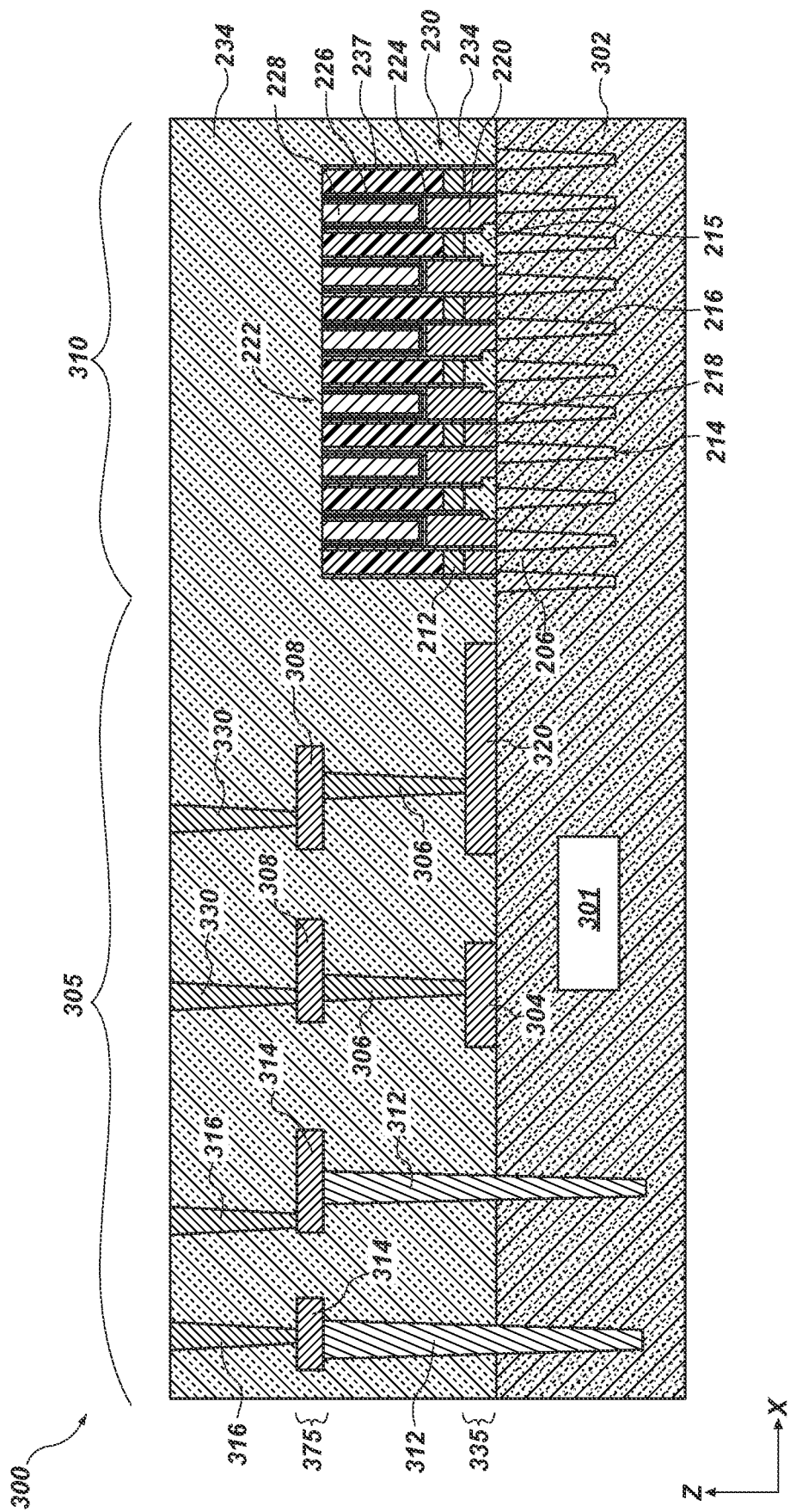
FIG. 2A through FIG. 2C are simplified partial cross-sectional views illustrating a method of forming a microelectronic device, in accordance with additional embodiments of the disclosure.
Figure 2B:
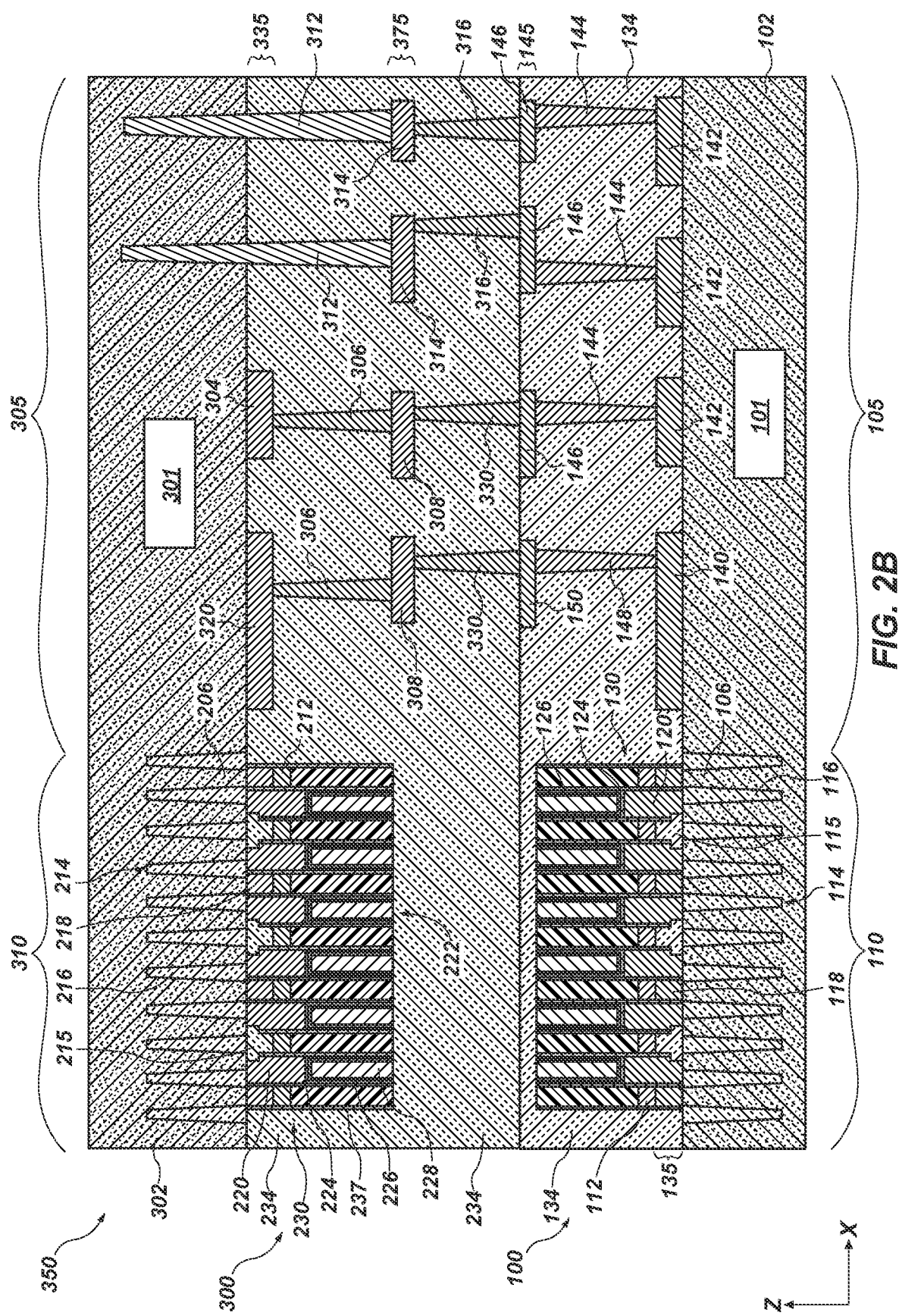
Figure 2C:
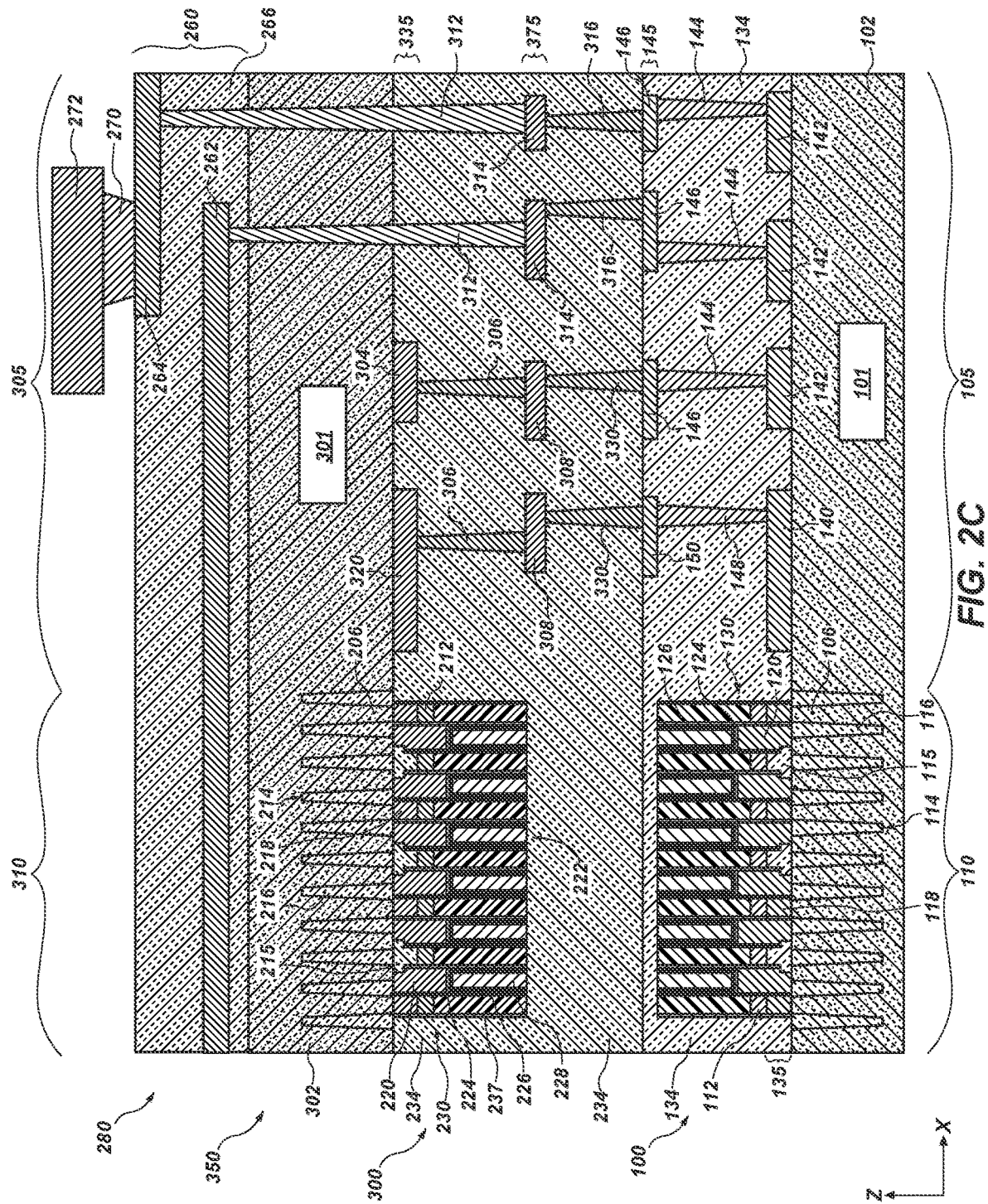

Although the microelectronic device 280 has been described and illustrated as including the second microelectronic device structure 200 having a particular configuration, the disclosure is not so limited. FIG. 2A through FIG. 2C illustrate a method of forming a microelectronic device is described, in accordance with embodiments of the disclosure.

FIG. 2A is a simplified partial cross-sectional view of a third microelectronic device structure 300. The third microelectronic device structure 300 may include a third array region 310 substantially the same as the second array region 210 of the second microelectronic device structure 200. The third microelectronic device structure 300 may further include a peripheral region 305 laterally (e.g., in the X-direction, in the Y-direction) neighboring the third array region 310. The third microelectronic device structure 300 may also be referred to herein as a "third die."

The third microelectronic device structure 300 may include a third base structure 302 substantially the same as the first base structure 102 and may include, for example, third control logic devices configured to effectuate at least a portion of control operations of the memory cells 230 of the third microelectronic device structure 300. In some embodiments, the third base structure 302 may include third conductive interconnect structures 252 vertically (e.g., in the Z-direction) extending through the second base structure 202.

The peripheral region 305 may include a metallization and local interconnect level 335 including third routing structures 320 electrically coupled to portions of the memory cells 230, as described above with reference to the first routing structures 140 (FIG. 1A). For example, the third routing structures 320 may be in electrical communication with word lines of the third microelectronic device structure 300 and with a word line driver of third control logic devices of a third control logic region 301 within the third base structure 302. Other third routing structures 320 may be in electrical communication with the digit lines 212 and with one or more sense amplifiers of the third control logic devices of the third control logic region 301. The third control logic devices of the third control logic region 301 may be substantially the same as the first control logic devices of the first control logic region 101 (FIG. 1A) of the first microelectronic device structure 100.

Second conductive pad structures 304 may be in electrical communication with the third base structure 302 within the peripheral region 305. The second conductive pad structures 304 may be in electrical communication with, for example, the third control logic devices of the third control logic region 301 of the third base structure 302. In some embodiments, the second conductive pad structures 304 and the third routing structures 320 comprise a portion of a first metallization level 335 of the third microelectronic device structure 300.

The second conductive pad structures 304 may be formed of and include conductive material, such as, for example, one or more of the materials described above with reference to the first conductive pad structures 142. In some embodiments, the second conductive pad structures 304 comprise tungsten. In other embodiments, the second conductive pad structures 304 comprise copper.

The third microelectronic device structure 300 may include a second metallization level 375 comprising third conductive pad structures 308 and fourth conductive pad structures 314. The second metallization level 375 may be located vertically between a first surface and a second opposing surface of the third microelectronic device structure 300. Third conductive interconnect structures 306 may vertically (e.g., in the Z-direction) extend through a portion of the third microelectronic device structure 300 and electrically couple portions of the first metallization level 335 to the second metallization level 375. For example, the third conductive interconnect structures 306 may electrically couple the second conductive pad structures 304 of the first metallization level 335 with the third conductive pad structures 308 of the second metallization level 375. The third conductive interconnect structures 306 may be formed of and include conductive material, such as one or more of the materials described above with reference to the first conductive interconnect structures 144. In some embodiments, the third conductive interconnect structures 306 comprise tungsten.

Some of the third conductive interconnect structures 306 may electrically couple the third routing structures 320 with some of the third conductive pad structures 308.

With continued reference to FIG. 3A, fourth conductive interconnect structures 330 may be electrically coupled to the third conductive pad structures 308. The fourth conductive interconnect structures 330 may be formed of and include conductive material, such as one or more of the materials described above with reference to the first conductive interconnect structures 144. In some embodiments, the fourth conductive interconnect structures 330 comprise tungsten.

In some embodiments, the third microelectronic device structure 300 includes fifth conductive interconnect structures 312 vertically (e.g., in the Z-direction) extending through the third microelectronic device structure 300 and in electrical communication with fourth conductive pad structures 314 within the second metallization level 375.

The fifth conductive interconnect structures 312 may be formed of and include conductive material, such as, for example, one or more of the materials described above with reference to the first conductive interconnect structures 144. In some embodiments, the fifth conductive interconnect structures 312 comprise substantially the same material composition as the first conductive interconnect structures 144. In some embodiments, the fifth conductive interconnect structures 312 comprise tungsten.

The fourth conductive pad structures 314 may be formed of and include conductive material, such as, for example, one or more of the materials described above with reference to the first conductive pad structures 142. In some embodiments, the fourth conductive pad structures 314 comprise tungsten. In other embodiments, the fourth conductive pad structures 314 comprise copper.

Sixth conductive interconnect structures 316 may vertically (e.g., in the Z-direction) extend through a portion of the third microelectronic device structure 300 and be electrically coupled to the fourth conductive pad structures 314 of the second metallization level 375. The sixth conductive interconnect structures 316 may be formed of and include conductive material, such as one or more of the materials described above with reference to the first conductive interconnect structures 144. In some embodiments, the sixth conductive interconnect structures 316 comprise tungsten.

Referring now to FIG. 3B, the third microelectronic device structure 300 may be inverted (e.g., flipped), laterally (e.g., in the X-direction, in the Y-direction) aligned with the first microelectronic device structure 100, and bonded to the first microelectronic device structure 100 to form a microelectronic device structure assembly 350. By way of non-limiting example, the first array region 110 of the first microelectronic device structure 100 may be laterally aligned with the third array region 310 of the third microelectronic device structure 300; and the peripheral region 105 of the first microelectronic device structure 100 may be laterally aligned with the peripheral region 305 of the third microelectronic device structure 300. In some embodiments, the third array region 310 of the third microelectronic device structure 300 may be located within lateral (e.g., in the X-direction, in the Y-direction) boundaries of the first array region 110 of the first microelectronic device structure 100.

In some embodiments, the third conductive interconnect structures 306 of the third microelectronic device structure 300 may be laterally aligned with the first conductive landing pad structures 146 or the second conductive landing pad structures 150 of the first metallization level 145 of the first microelectronic device structure 100; and the sixth conductive interconnect structures 316 may be laterally aligned with additional first conductive landing pad structures 146 of the first microelectronic device structure 100.

In some embodiments, surfaces of the third microelectronic device structure 300 may contact corresponding surfaces of the first microelectronic device structure 100 and the third microelectronic device structure 300 may be bonded to the first microelectronic device structure 100, as described above with reference to bonding the second microelectronic device structure 200 to the first microelectronic device structure 100 of FIG. 1E. The first microelectronic device structure 100 and the third microelectronic device structure 300 may be exposed to annealing conditions to form bonds (e.g., oxide-to-oxide bonds) between the insulative material 134 of the first microelectronic device structure 100 and the insulative material 234 of the third microelectronic device structure 300 to form the microelectronic device structure assembly 350, as described above with reference to FIG. 1E.

In some embodiments, the second metallization level 375 may facilitate formation of the fourth conductive interconnect structures 330 and the sixth conductive interconnect structures 316 at a smaller pitch P relative to, for examine, the corresponding pitch of the first conductive interconnect structures 144 and the fourth conductive interconnect structures 248 and the fifth conductive interconnect structures 244 of the microelectronic device 280 (FIG. 1F).

Referring now to FIG. 2C, after bonding the third microelectronic device structure 300 to the first microelectronic device structure 100, the third base structure 302 may be thinned, such as by exposing the third base structure 302 to a CMP process. In some embodiments, thinning the third base structure 302 may expose at least a portion of the fifth conductive interconnect structures 312.

After thinning the third base structure 302, a back end of line (BEOL) structure 260 may be formed vertically (e.g., in the Z-direction) over the third base structure 302 on a side of the third base structure 302 opposite the memory cells 230 to form a microelectronic device 380, as described above with reference to FIG. 1F. The back end of line structure 260 may be substantially the same as the back end of line structure 260 of FIG. 1F.

Accordingly, the microelectronic device 380 includes a first microelectronic device structure 100 attached to the third microelectronic device structure 300. The first microelectronic device structure 100 includes the first array region 110 including the memory cells 130. The first microelectronic device structure 100 further includes the first base structure 102 including the control logic devices of the first control logic region 101 for effectuating at least some of the control operations of the memory cells 130. The third microelectronic device structure 300 includes the third array region 310 including the memory cells 230. The third microelectronic device structure 300 further includes the third base structure 302 including the third logic devices of the third control logic region 301 for effectuating at least some of the control operations of the memory cells 230. In some embodiments, the third microelectronic device structure 300 includes the second metallization level 375, which may facilitate forming conductive structures (e.g., the fourth conductive interconnect structures 330 and the sixth conductive interconnect structures 316) to be formed at a smaller pitch compared to conventional microelectronic devices. In some embodiments, the first microelectronic device structure 100 and the third microelectronic device structure 300 share one or more metallization levels (e.g., the back end of line structure 260 including the first metallization structure 262 and the second metallization structure 264). The shared metallization levels may facilitate forming a higher density of memory cells within a given area by allowing stacking of the first microelectronic device structure 100 and the third microelectronic device structure 300 and facilitating a reduction in the number of metallization levels (and a decrease in the fabrication costs) of the microelectronic device 380 compared to conventional microelectronic devices.

This, in accordance with some embodiments of the disclosure, a microelectronic device comprises a first microelectronic device structure, a second microelectronic device structure attached to the first microelectronic device structure. The first microelectronic device structure comprises a first memory array region comprising memory cells, each of the memory cells comprising an access device and a charge storage device operably coupled to the access device. The first microelectronic device structure further comprises a first base structure comprising first control logic devices configured to effectuate one or more control operations of the memory cells of the first memory array region. The second microelectronic device structure comprises a second memory array region comprising additional memory cells, each of the additional memory cells comprising an additional access device and an additional charge storage device operably coupled to the additional access device. The second microelectronic device further a second base structure comprising second control logic devices configured to effectuate one or more control operations of the additional memory cells of the second memory array region.

Thus, in accordance with additional embodiments of the disclosure, a microelectronic device comprises a first die and a second die. The first die comprises a first memory array region comprising dynamic random-access memory (DRAM) cells, a first base structure vertically neighboring the first memory array region, the first base structure comprising first control logic devices configured to effectuate at least some control operations of the DRAM cells, and conductive landing pad structures on a side of the first die opposite the first base structure. The second die comprises a second memory array region comprising additional DRAM cells, and a second base structure vertically neighboring the second memory array region, the second base structure comprising second control logic devices configured to effectuate at least some control operations of the additional DRAM cells. The microelectronic device further comprises conductive interconnect structures vertically extending through the second die and in electrical communication with the conductive landing pads of the first die and with a back end of line structure on a side of the second die opposite the conductive landing pads.

Thus, in accordance with yet other embodiments of the disclosure a method of forming a microelectronic device comprises forming a first microelectronic device structure, forming a second microelectronic device structure, and attaching the second microelectronic device structure to the first microelectronic device structure. The first microelectronic device structure comprises a first memory array region comprising memory cells, each of the memory cells comprising an access device and a capacitor, and a first control logic region within a first base structure vertically underlying the memory cells, the first control logic region comprising first control logic devices configured for effectuating at least some control operations of the memory cells. The second microelectronic device structure comprises a second memory array region comprising additional memory cells, each of the additional memory cell comprising an additional access device and an additional capacitor, and a second control logic region within a second base structure vertically underlying the additional memory cells, the second control logic regions comprising second control logic devices configured for effectuating at least some control operations of the additional memory cells.

Figure 3:
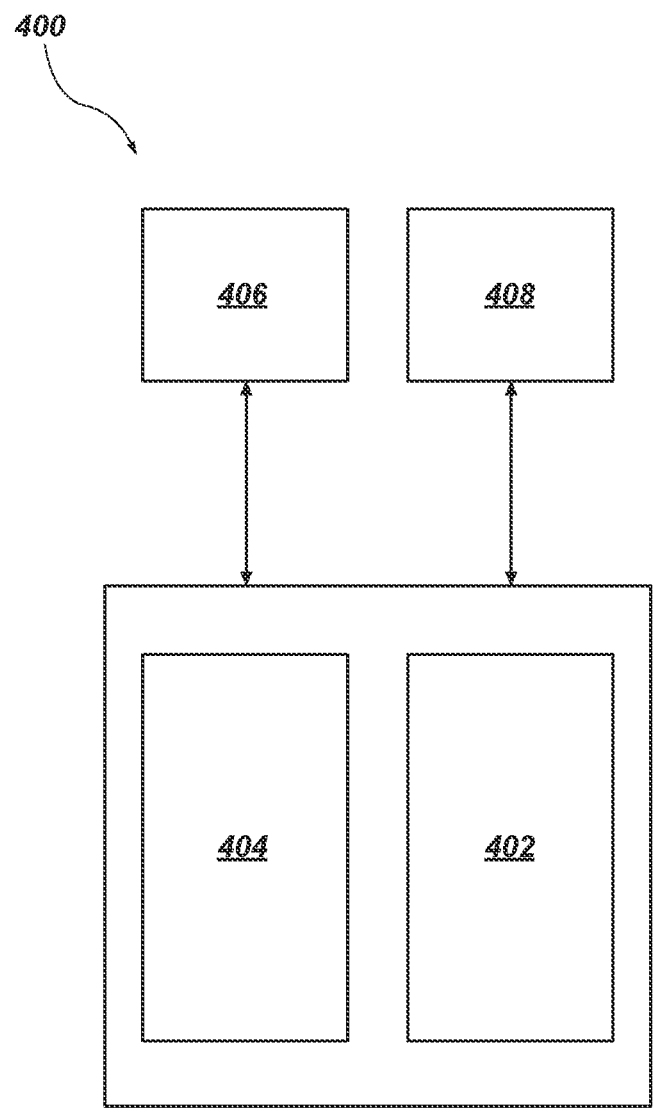
FIG. 3 is a schematic block diagram of an electronic system, in accordance with an embodiment of the disclosure.

Structures, assemblies, and devices in accordance with embodiments of the disclosure may be used in embodiments of electronic systems of the disclosure. For example, FIG. 3 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may comprise, for example, an embodiment of one or more of a microelectronic device structure, a microelectronic device structure assembly, a relatively larger microelectronic device structure assembly, and a microelectronic device previously described herein with reference to FIG. 1A through FIG. 2C. The electronic system 400 may further include at least one electronic signal processor device 404 (often referred to as a "microprocessor"). The electronic signal processor device 404 may, optionally, include an embodiment of one or more of a microelectronic device structure, a microelectronic device structure assembly, a relatively larger microelectronic device structure assembly, and a microelectronic device previously described herein with reference to FIG. 1A through FIG. 2C. While the memory device 402 and the electronic signal processor device 404 are depicted as two (2) separate devices in FIG. 3, in additional embodiments, a single (e.g., only one)

memory/processor device having the functionalities of the memory device 402 and the electronic signal processor device 404 is included in the electronic system 400. In such embodiments, the memory/processor device may include one or more of a microelectronic device structure, a microelectronic device structure assembly, a relatively larger microelectronic device structure assembly, and a microelectronic device previously described herein with reference to FIG. 1A through FIG. 2C. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, one or more of a monitor, a display, a printer, an audio output jack, and a speaker. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, in accordance with embodiments of the disclosure, an electronic system comprises an input device, an output device, a processor device operably coupled to the input device and the output device, and a memory device operably coupled to the processor device. The memory device comprises a first die and a second die attached to the first die. The first die comprises first memory cells, each of the first memory cells individually comprising a capacitor, a first base structure comprising first control logic devices configured to effectuate at least some control operations of the first memory cells, a first oxide material vertically overlying the first memory cells, and conductive bond pad structures within the first oxide material. The second die comprises second memory cells, each of the second memory cells individually comprising an additional capacitor, a second base structure comprising second control logic devices configured to effectuate at least some control operations of the second memory cells, and a second oxide material vertically overlying the second memory cells, the second oxide material bonded to the first oxide material, and conductive interconnect structures vertically extending through the second die and in electrical communication with the conductive bond pad structures.

The methods, structures, assemblies, devices, and systems of the disclosure advantageously facilitate one or more of improved performance, reliability, durability, increased miniaturization of components, improved pattern quality, and greater packaging density as compared to conventional methods, conventional structures, conventional assemblies, conventional devices, and conventional systems. The methods, structures, and assemblies of the disclosure may substantially alleviate problems related to the formation and processing of conventional microelectronic devices, such as undesirable feature damage (e.g., corrosion damage), deformations (e.g., warping, bowing, dishing, bending), and performance limitations (e.g., speed limitations, data transfer limitations, power consumption limitations).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
a first microelectronic device structure comprising:
a first memory array region comprising memory cells, each of the memory cells comprising:
an access device; and
a charge storage device operably coupled to the access device; and
a first base structure comprising first control logic devices configured to effectuate one or more control operations of the memory cells of the first memory array region, each access device of the first memory array region located within the first base structure; and
a second microelectronic device structure attached to the first microelectronic device, the second microelectronic device structure comprising:
a second memory array region comprising additional memory cells, each of the additional memory cells comprising:
an additional access device; and
an additional charge storage device operably coupled to the additional access device; and
a second base structure comprising second control logic devices configured to effectuate one or more control operations of the additional memory cells of the second memory array region.

2. The microelectronic device of claim 1, wherein:
the charge storage devices of the first memory array region comprise capacitors; and
the additional charge storage devices of the second memory array region comprise additional capacitors.

3. The microelectronic device of claim 1, wherein the first memory array region and the second memory array region vertically intervene between the first base structure and the second base structure.

4. The microelectronic device of claim 1, wherein the first microelectronic device structure comprises at least one of:
an oxide material at an interface between the first microelectronic device structure and the second microelectronic device structure; and
conductive landing pads at the interface between the first microelectronic device structure and the second microelectronic device structure.

5. The microelectronic device of claim 4, wherein the second microelectronic device structure comprises conductive interconnect structures in physical contact with the conductive landing pads of the first microelectronic device structure at the interface or spaced from the interface by the oxide material.

6. The microelectronic device of claim 1, further comprising conductive interconnect structures vertically extending through the second microelectronic device structure and in electrical communication with conductive pad structures of the first microelectronic device structure.

7. The microelectronic device of claim 1, wherein the second memory array region is located within lateral boundaries of the first memory array region, an oxide material vertically intervening between the second memory array region and the first memory array region.

8. The microelectronic device of claim 1, wherein:
the first control logic devices of the first base structure comprise word line drivers and sense amplifiers; and
the second control logic devices of the second base structure comprise additional word line drivers and additional sense amplifiers.

9. A microelectronic device, comprising:
a first die comprising:
  a first memory array region comprising dynamic random-access memory (DRAM) cells;
  a first base structure vertically neighboring the first memory array region, the first base structure comprising first control logic devices configured to effectuate at least some control operations of the DRAM cells; and
  conductive landing pad structures on a side of the first die opposite the first base structure;
a second die comprising:
  a second memory array region comprising additional DRAM cells; and
  a second base structure vertically neighboring the second memory array region, the second base structure comprising second control logic devices configured to effectuate at least some control operations of the additional DRAM cells; and
conductive interconnect structures vertically extending through the second die and in electrical communication with the conductive landing pads of the first die at an interface between the first die and the second die, the conductive interconnect structures in electrical communication with a back end of line structure on a side of the second die opposite the conductive landing pads, the back end of line structure shared between the first die and the second die.

10. The microelectronic device of claim 9, wherein the conductive interconnect structures comprise copper.

11. The microelectronic device of claim 10, wherein the conductive landing pads comprise additional copper.

12. The microelectronic device of claim 9, wherein the back end of line structure comprises copper.

13. The microelectronic device of claim 9, wherein the conductive interconnect structures and the conductive landing pads comprise substantially the same material composition.

14. The microelectronic device of claim 9, further comprising an oxide material vertically interposed between the DRAM cells of the first die and the additional DRAM cells of the second die.

15. The microelectronic device of claim 9, wherein the first control logic devices are vertically separated from the second control logic devices by the first memory array region and the second memory array region.

16. The microelectronic device of claim 9, wherein the first die comprises one or more metallization levels.

17. The microelectronic device of claim 9, wherein the second control logic devices are vertically interposed between the second memory array region and the back end of line structure.

18. The microelectronic device of claim 9, wherein the first control logic devices have substantially the same configuration as the second control logic devices.

19. A method of forming a microelectronic device, the method comprising:
forming a first microelectronic device structure comprising:
  a first memory array region comprising memory cells, each of the memory cells comprising an access device and a capacitor; and
  a first control logic region within a first base structure vertically underlying the memory cells, the first control logic region comprising first control logic devices configured for effectuating at least some control operations of the memory cells, the access devices of the first memory array region within the first base structure;
forming a second microelectronic device structure comprising:
  a second memory array region comprising additional memory cells, each of the additional memory cells comprising an additional access device and an additional capacitor; and
  a second control logic region within a second base structure vertically underlying the additional memory cells, the second control logic regions comprising second control logic devices configured for effectuating at least some control operations of the additional memory cells; and
attaching the second microelectronic device structure to the first microelectronic device structure.

20. The method of claim 19, wherein forming a first microelectronic device structure comprises forming conductive landing pad structures comprising copper vertically above the capacitors.

21. The method of claim 20, wherein attaching the second microelectronic device structure to the first microelectronic device structure comprises electrically coupling the conductive landing pad structures to conductive interconnect structures vertically extending through the second microelectronic device structure.

22. The method of claim 19, wherein attaching the second microelectronic device structure to the first microelectronic device structure comprises forming oxide-to-oxide bonds between the first microelectronic device structure and the second microelectronic device structure.

23. The method of claim 19, wherein attaching the second microelectronic device structure to the first microelectronic device structure comprises disposing the first control logic region on a side of the first microelectronic device structure opposite the second microelectronic device structure.

24. The method of claim 19, further comprising forming conductive interconnect structures comprising copper extending through the second microelectronic device structure.

25. The method of claim 19, further comprising thinning the second base structure after attaching the second microelectronic device structure to the first microelectronic device structure.

26. The method of claim 25, further comprising forming a back end of line structure on a side of the second microelectronic device structure opposite the first microelectronic device structure.

27. An electronic system, comprising:
an input device;
an output device;
a processor device operably coupled to the input device and the output device; and
a memory device operably coupled to the processor device and comprising:
  a first die comprising:
    first memory cells, each of the first memory cells individually comprising a capacitor;

a first base structure comprising first control logic devices configured to effectuate at least some control operations of the first memory cells;

a first oxide material vertically overlying the first memory cells; and conductive bond pad structures within the first oxide material; and a second die attached to the first die, the second die comprising:

second memory cells, each of the second memory cells individually comprising an additional capacitor;

a second base structure comprising second control logic devices configured to effectuate at least some control operations of the second memory cells;

a second oxide material vertically overlying the second memory cells, the second oxide material bonded to the first oxide material; and conductive interconnect structures vertically extending through the second die and in electrical communication with the conductive bond pad structures.

* * * * *

UNITED STATES PATENT AND TRADEMARK OFFICE
CERTIFICATE OF CORRECTION

PATENT NO. : 11,810,838 B2
APPLICATION NO. : 17/364292
DATED : November 7, 2023
INVENTOR(S) : Fatma Arzum Simsek-Ege Page 1 of 1

It is certified that error appears in the above-identified patent and that said Letters Patent is hereby corrected as shown below:

On the Title Page
In ITEM (57) ABSTRACT Line 17, change "device further a second" to --device further comprises a second--

In the Specification
Column 1, Line 33, change "a capacitor, Modern" to --a capacitor. Modern--
Column 1, Line 38, change "word lines access lines)" to --word lines (e.g., access lines)--
Column 1, Line 50, change "quantities, dimensions and" to --quantities, dimensions, and--
Column 4, Line 34, change "palladium (Pa)," to --palladium (Pd),--

Signed and Sealed this
Thirteenth Day of February, 2024

Katherine Kelly Vidal
*Director of the United States Patent and Trademark Office*